(12) United States Patent
Han

(10) Patent No.: US 11,327,532 B2
(45) Date of Patent: May 10, 2022

(54) FOLDABLE DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Baixiang Han, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 310 days.

(21) Appl. No.: 16/615,163

(22) PCT Filed: Nov. 5, 2019

(86) PCT No.: PCT/CN2019/115740
§ 371 (c)(1),
(2) Date: Nov. 20, 2019

(87) PCT Pub. No.: WO2021/012465
PCT Pub. Date: Jan. 28, 2021

(65) Prior Publication Data
US 2021/0358355 A1    Nov. 18, 2021

(30) Foreign Application Priority Data
Jul. 22, 2019    (CN) .......................... 201910660449.3

(51) Int. Cl.
*G06F 1/16* (2006.01)
*G09G 3/00* (2006.01)
(Continued)

(52) U.S. Cl.
CPC ............ *G06F 1/1652* (2013.01); *G09F 9/301* (2013.01); *G09G 3/035* (2020.08);
(Continued)

(58) Field of Classification Search
CPC .. G06F 1/1652; G09G 2380/02; G09G 9/301; G09G 3/035
See application file for complete search history.

(56) References Cited

U.S. PATENT DOCUMENTS 9,691,345 B2    6/2017  Park et al.
10,840,464 B2 *  11/2020  Hiroki ................. H01L 51/0097
(Continued)

FOREIGN PATENT DOCUMENTS

CN    204129382 U    1/2015
CN    106158904 A    11/2016
(Continued)

OTHER PUBLICATIONS

Incoming Written Opinion of the ISA dated Apr. 24, 2020—with PTO-generated Google machine translation.

*Primary Examiner* — Laurence J Lee
(74) *Attorney, Agent, or Firm* — Osha Bergman Watanabe & Burton LLP

(57) ABSTRACT

A foldable display panel comprises a first display area, a second display area, a third display area, a first folding area, and a second folding area. The first folding area is configured to connect the first display area and the second display area. The second folding area is configured to connect the third display area and the second display area. When the first folding area is in a folded state, the first display area is located directly above the second display area. When the second folding area is in a folded state, the third display area is located directly below the second display area. A first sub-pixel of the first display area, and both a second sub-
(Continued)

pixel of the second display area and a third sub-pixel of the third display area, each corresponding to the first sub-pixel, constitute a single pixel unit of the combined display panel.

13 Claims, 2 Drawing Sheets

(51) Int. Cl.
 *G09F 9/30* (2006.01)
 *H01L 27/32* (2006.01)
(52) U.S. Cl.
 CPC . *H01L 27/3218* (2013.01); *G09G 2300/0452* (2013.01); *G09G 2300/0465* (2013.01); *G09G 2380/02* (2013.01)

(56) References Cited

U.S. PATENT DOCUMENTS

| | | |
|---|---|---|
| 2011/0181178 A1 | 7/2011 | Vaudrey et al. |
| 2019/0339743 A1 | 11/2019 | Miyake et al. |
| 2020/0168821 A1* | 5/2020 | Cao .................... H01L 51/5253 |

FOREIGN PATENT DOCUMENTS

| | | |
|---|---|---|
| CN | 108987574 A | 12/2018 |
| CN | 109065572 A | 12/2018 |
| CN | 109256410 A | 1/2019 |

* cited by examiner

FOLDABLE DISPLAY PANEL

CROSS REFERENCE TO RELATED APPLICATION

This application claims the priority of International Application No. PCT/CN2019/115740, filed on 2019 Nov. 5, which claims priority to Chinese Application No. 201910660449.3, filed on 2019 Jul. 22. The entire disclosures of each of the above applications are incorporated herein by reference.

BACKGROUND OF INVENTION

Field of Invention

The present invention relates to the field of electronic display, and in particular, to a foldable display panel.

Description of Prior Art

With the continuous development of display technology, users have higher requirements for resolution and service life of display panels. However, due to the process capability, as the resolution increases, aperture ratio and service life of the display panel will inevitably decrease.

Technical Problems

Referring to FIG. 1, a pixel of a display panel in the prior art is schematically illustrated. Because only a single-colored light is allowed to pass at the same time, aperture ratio of the display panel in the prior art is only about 33%, which needs to be improved.

SUMMARY OF INVENTION

The present application provides a foldable display panel to increase the aperture ratio of the display panel in the prior art.

In order to solve the above problems, the present application provides a foldable display panel comprising:

a first display area comprising a plurality of first sub-pixels;

a second display area comprising a plurality of second sub-pixels, and the plurality of second sub-pixels are disposed corresponding to the first sub-pixels;

a first folding area being configured to connect the first display area and the second display area, when the first folding area is in a folded state, the first display area is located directly above the second display area;

a third display area comprising a plurality of third sub-pixels, and the plurality of third sub-pixels are disposed corresponding to the second sub-pixels;

a second folding area being configured to connect the third display area and the second display area, when the second folding area is in a folded state, the third display area is located directly below the second display area;

wherein a first sub-pixel, and both a second sub-pixel and a third sub-pixel, each corresponding to the first sub-pixel, constitute a single pixel unit of the combined display panel.

According to one aspect of the application, wherein the plurality of first sub-pixels, second sub-pixels, and third sub-pixels have a same shape and area.

According to one aspect of the application, wherein the first display area and the second display area are two-way illuminated display screens, and the third display area is a single-sided illuminated display screen.

According to one aspect of the application, wherein a light-emitting surface of the third display area is a surface facing the second display area when folded.

According to one aspect of the application, wherein the third sub-pixel is a red sub-pixel.

According to one aspect of the application, wherein the first sub-pixel is a blue sub-pixel.

According to one aspect of the application, further comprising a non-display area, wherein the non-display area is disposed on a side of the first display area away from the second display area, or disposed on a side of the third display area away from the second display area, the non-display area is disposed to set a control circuit.

According to one aspect of the application, wherein control signals of the first display area, the second display area, and the third display area are the same, a first sub-pixel and the corresponding second sub-pixel and third sub-pixel receive a same display information.

According to one aspect of the application, wherein the first folding area is an axisymmetric figure, a symmetrical axis of the first folding area is a first symmetrical axis, the first display area and the second display area are symmetric about the first axis of symmetry, a distribution pattern of the first sub-pixels and a distribution pattern of the second sub-pixels are symmetric along the first symmetrical axis.

According to one aspect of the application, wherein deformation of the first folding area rotates the first display area along the first symmetrical axis to cover the second display area, each of the first sub-pixels is located directly above the second sub-pixel corresponding thereto.

According to one aspect of the application, wherein the second folding area is an axisymmetric figure, a symmetrical axis of symmetry of the second folding area is a second symmetrical axis, the second display area and the third display area are symmetric along the second symmetrical axis, a distribution pattern of the second sub-pixels and a distribution pattern of the third sub-pixels are symmetric along the second symmetrical axis.

According to one aspect of the application, wherein deformation of the second folding area rotates the third display area along the first symmetrical axis to cover the second display area, each of the third sub-pixels is located directly below the second sub-pixel corresponding thereto.

According to one aspect of the application, further comprising a plurality of first support columns between the first display area and the second display area, and a plurality of second support columns between the second display area and the third display area.

According to one aspect of the application, wherein a material forming the plurality of first support columns and the second support columns is a white material or a transparent material, and surfaces of support columns have a diffuse reflection structure.

Beneficial Effects

The foldable display panel provided by the present application includes a corresponding first sub-screen, a second sub-screen, and a third sub-screen. The plurality of first sub-pixels, second sub-pixels, and third sub-pixels of the present application are disposed on different display surfaces respectively and are corresponding arranged. In the present application, a first sub-pixel, and both a second sub-pixel and a third sub-pixel, each corresponding to the first sub-pixel, constitute a single pixel unit of the combined display panel. With this arrangement, no matter which sub-pixel emits light, the aperture ratio of the pixel unit of the foldable display panel approaches 100%. Therefore, the present application greatly improves the aperture ratio of the display panel and optimizes the display effect of the display panel.

DETAILED DESCRIPTION OF PREFERRED EMBODIMENTS

Figure 1:
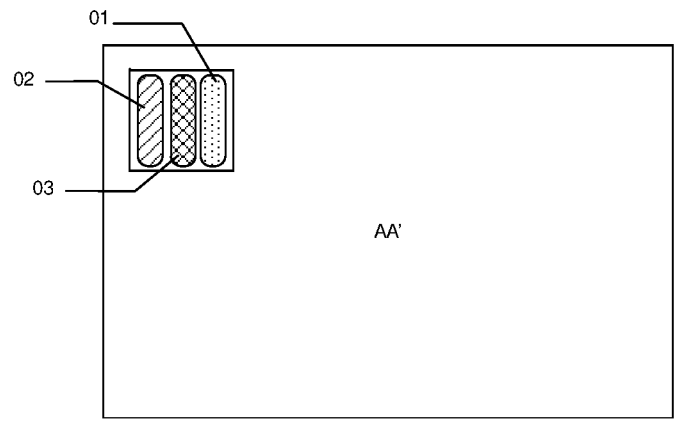
FIG. 1 is a structural diagram of a display panel in the prior art.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

First, the prior art will be briefly described. Referring to FIG. 1, a display panel of the prior art includes a display area AA', which includes a plurality of pixel units. FIG. 1 exemplarily shows a schematic diagram of a pixel unit in which each pixel unit includes a first sub-pixel 01, a second sub-pixel 02, and a third sub-pixel 03. The first sub-pixel 01, the second sub-pixel 02, and the third sub-pixel 03 emit red light, blue light, and green light respectively. When display, each pixel unit can emit only one color of light at the same time, so the aperture ratio of the display panel in the prior art is only about 33%, which needs to be improved.

The present application provides a foldable display panel to increase the aperture ratio of the display panel in the prior art.

Figure 2:
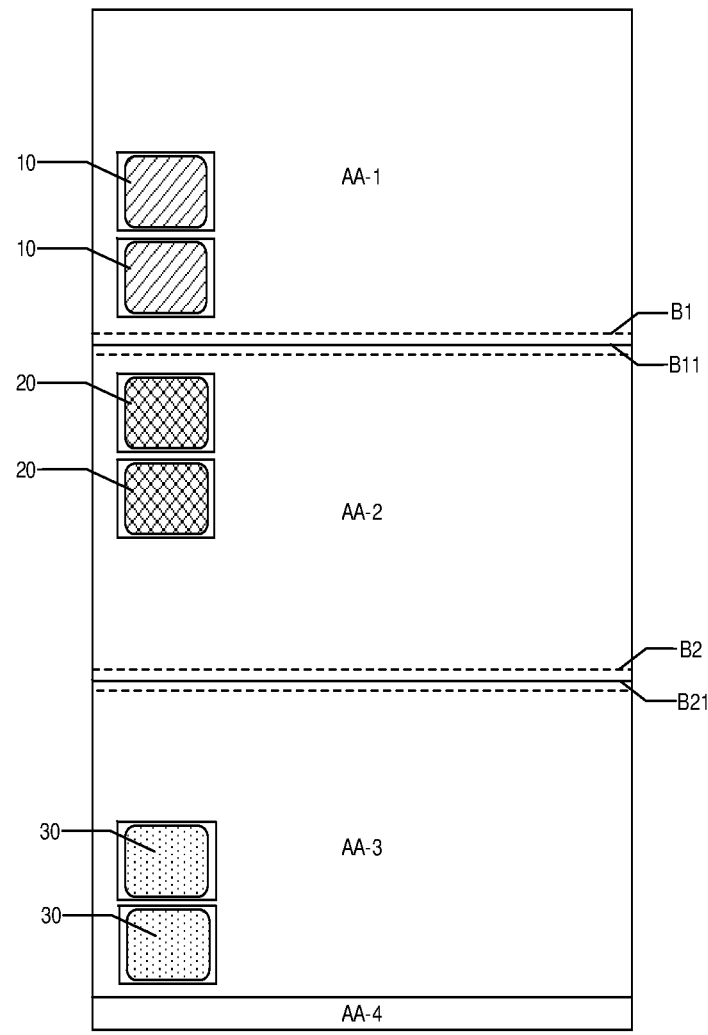
FIG. 2 is a structural diagram of a foldable display panel in an unfolded state according to an embodiment of the present application.
Figure 3:
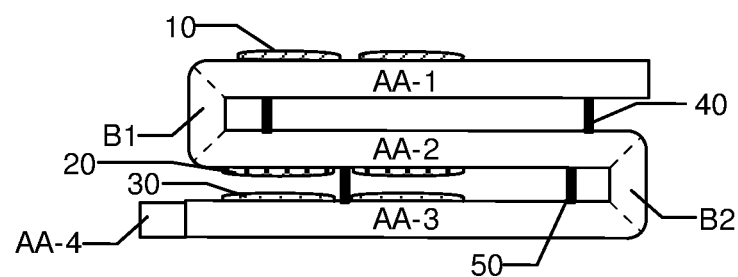
FIG. 3 is a structural diagram of the foldable display panel of FIG. 2 in a folded state.

Referring to FIG. 2 and FIG. 3, FIG. 2 is a structural diagram of a foldable display panel in an unfolded state according to an embodiment of the present application. FIG. 3 is a structural diagram of the foldable display panel of FIG. 2 in a folded state.

Referring to FIG. 2 and FIG. 3, the foldable display panel in the present application includes a first display area AA-1, a second display area AA-2, a first folding area B1, a third display area AA-3, a second folding area B2, and a non-display area AA-4 arranged side by side.

The first display area AA-1 comprising a plurality of first sub-pixels 10. The second display area AA-2 comprising a plurality of second sub-pixels 20, and the plurality of second sub-pixels 20 are disposed corresponding to the first sub-pixels 10. The first folding area B1 being configured to connect the first display area AA-1 and the second display area AA-2, when the first folding area B1 is in a folded state, the first display area AA-1 is located directly above the second display area AA-2.

The third display area AA-3 comprising a plurality of third sub-pixels 30, and the plurality of third sub-pixels 30 are disposed corresponding to the second sub-pixels 20. The second folding area B2 being configured to connect the third display area AA-3 and the second display area AA-2, when the second folding area B2 is in a folded state, the third display area AA-3 is located directly below the second display area AA-2.

In the present application, the plurality of first sub-pixels 10, second sub-pixels 20, and third sub-pixels 30 have a same shape and area. Referring to FIG. 3, when the first folding area B1 and the second folding area B2 are in a folded state, a first sub-pixel 10, and both a second sub-pixel 20 and a third sub-pixel 30, each corresponding to the first sub-pixel 10, constitute a single pixel unit of the foldable display panel.

In the present application, the first display area AA-1 and the second display area AA-2 are double-sided illuminated display screens. an anode of the first display area AA-1 and an anode of the second display area AA-2 are transparent electrodes, and cathodes of them are transparent electrodes. The third display area AA-3 is a single-sided illuminated display screen, and the light emitting surface of the third display area is a surface facing the second display area when folded. The anode of the third display area AA-3 is a reflective electrode, and the cathode is a transparent electrode. The reflective electrode can be a metal electrode such as silver, copper, gold or the like having good electrical conductivity and reflectivity. The transparent electrode can be a transparent conductive material such as indium tin oxide.

In this embodiment, the third sub-pixel 30 is a red sub-pixel. This is because, among the three colors of red, green and blue, the red light has the longest wavelength and the corresponding penetration ability is also the strongest. Since the third sub-pixel 30 is farthest from the light-emitting surface of the display panel, it needs to penetrate the first sub-screen D1 to reach the light emitting surface, and the corresponding light loss is the most. In this embodiment, setting the third sub-pixel 30 as a red sub-pixel can minimize the light loss. In addition, such arrangement can also make the light emitted by a plurality of pixel points more uniform, and enhance the display effect of the display panel.

Correspondingly, due to a wavelength of blue light is the shortest, its corresponding penetration ability is also the worst. In order to reduce the light loss, the blue sub-pixels are prevented from accelerating aging due to excessive loss. In this embodiment, the first sub-pixels 10 are set as blue sub-pixels. The first sub-pixels 10 are disposed on the display surface closest to the light emitting surface of the display panel.

In the prior art, since the aging speed of the blue sub-pixel is fast, a lifetime of the blue sub-pixel determines a life of the display panel. The display panel of the present invention sets the blue sub-pixel on the display surface closest to the light emitting surface of the display panel, and greatly reduces the power consumption of the blue sub-pixel. Therefore, the display panel of the present application significantly slows down the aging of the blue sub-pixels, thereby extending the life of the display panel.

In this embodiment, the folding display panel further comprises a non-display area AA-4, wherein the non-display area AA-4 is disposed on a side of the first display area AA-1 away from the second display area AA-2, or disposed on a side of the third display area AA-3 away from the second display area AA-2, the non-display area AA-4 is disposed to set a control circuit. Control signals of the first display area AA-1, the second display area AA-2, and the third display area AA-3 are the same, a first sub-pixel 10 and the corresponding second sub-pixel 20 and third sub-pixel 30 receive a same display information.

In this embodiment, the first display area AA-1, the second display area AA-2, and the third display area AA-3 are rectangular with a same shape and area.

In this embodiment, the first folding area B1 is an axisymmetric figure, a symmetrical axis of the first folding area B1 is a first symmetrical axis B11, the first display area AA-1 and the second display area AA-2 are symmetric about first symmetrical axis B11, a distribution pattern of the first sub-pixels 10 and a distribution pattern of the second sub-pixels 20 are symmetric along the first symmetrical axis B11. Deformation of the first folding area B1 rotates the first display area AA-1 along the first symmetrical axis B11 to cover the second display area AA-2, each of the first sub-pixels 10 is located directly above the second sub-pixel 20 corresponding thereto. The first folding area B1 can be a hinge structure or a flexible bendable structure.

In this embodiment, the second folding area B2 is an axisymmetric figure, a symmetrical axis of symmetry of the second folding area B2 is a second symmetrical axis B21, the second display area AA-2 and the third display area AA-3 are symmetric along the second symmetrical axis B21, a distribution pattern of the second sub-pixels 20 and a distribution pattern of the third sub-pixels 30 are symmetric along the second symmetrical axis B21. Deformation of the second folding area B2 rotates the third display area AA-3 along the second symmetrical axis B21 to cover the second display area AA-2, each of the third sub-pixels 30 is located directly below the second sub-pixel 20 corresponding thereto. The second folding area B2 can be a hinge structure or a flexible bendable structure.

According to one aspect of the application, the foldable display panel further includes a plurality of first support columns 40 between the first display area AA-1 and the second display area AA-2, and a plurality of second support columns 50 between the second display area AA-2 and the third display area AA-3.

The plurality of first support columns 40 and the second support columns 50 have a same height. On the one hand, the support columns 40 is used for supporting the three display areas to disperse the pressure applied to the second display area AA-2 and the third display area AA-3 and prevent the second display area AA-2 and the third display area AA-3 from being cracked due to uneven force. On the other hand, they can ensure that the distances between the three display areas are kept constant, and avoid pixel cell offset due to a change in distance between the display surfaces. Preferably, in order to prevent the support columns 40 and the second support columns 50 from forming a spot or a shadow on the display panel, the material forming the support columns 40 and the second support columns 50 is a white material or a transparent material, and surfaces of the plurality of support pillars 40 and the second support columns 50 have a diffuse reflection structure.

The foldable display panel provided by the present application includes a corresponding first sub-screen, a second sub-screen, and a third sub-screen. The plurality of first sub-pixels, second sub-pixels, and third sub-pixels of the present application are disposed on different display surfaces respectively and are corresponding arranged. In the present application, a first sub-pixel, and both a second sub-pixel and a third sub-pixel, each corresponding to the first sub-pixel, constitute a single pixel unit of the combined display panel. With this arrangement, no matter which sub-pixel emits light, the aperture ratio of the pixel unit of the foldable display panel approaches 100%. Therefore, the present application greatly improves the aperture ratio of the display panel and optimizes the display effect of the display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A foldable display panel, comprising:
   a first display area comprising a plurality of first sub-pixels;
   a second display area comprising a plurality of second sub-pixels, the plurality of second sub-pixels disposed corresponding to the first sub-pixels;
   a first folding area being configured to connect the first display area and the second display area, and when the first folding area is in a folded state, the first display area is located directly above the second display area;
   a third display area comprising a plurality of third sub-pixels, the plurality of third sub-pixels disposed corresponding to the second sub-pixels;
   a second folding area configured to connect the third display area and the second display area, and when the second folding area is in a folded state, the third display area is located directly below the second display area; and
   a plurality of first support columns between the first display area and the second display area, and a plurality of second support columns between the second display area and the third display area,
   wherein a first sub-pixel, and both a second sub-pixel and a third sub-pixel, each corresponding to the first sub-pixel, constitute a single pixel unit of the combined display panel.

2. The foldable display panel according to claim 1, wherein the plurality of first sub-pixels, second sub-pixels, and third sub-pixels have a same shape and area.

3. The foldable display panel according to claim 1, wherein the first display area and the second display area are two-way illuminated display screens, and the third display area is a single-sided illuminated display screen.

4. The folding display panel according to claim 3, wherein a light-emitting surface of the third display area is a surface facing the second display area when folded.

5. The foldable display panel according to claim 4, wherein the third sub-pixel is a red sub-pixel.

6. The foldable display panel according to claim 5, wherein the first sub-pixel is a blue sub-pixel.

7. The folding display panel according to claim 1, further comprising a non-display area, wherein the non-display area is disposed on a side of the first display area away from the second display area, or disposed on a side of the third display area away from the second display area, the non-display area is disposed to set a control circuit.

8. The folding display panel according to claim 7, wherein control signals of the first display area, the second display area, and the third display area are the same, a first sub-pixel and the corresponding second sub-pixel and third sub-pixel receive a same display information.

9. The folding display panel according to claim 1, wherein the first folding area is an axisymmetric figure, a symmetrical axis of the first folding area is a first symmetrical axis, the first display area and the second display area are symmetric about the first axis of symmetry, a distribution pattern of the first sub-pixels and a distribution pattern of the second sub-pixels are symmetric along the first symmetrical axis.

10. The folding display panel according to claim 9, wherein deformation of the first folding area rotates the first display area along the first symmetrical axis to cover the second display area, each of the first sub-pixels is located directly above the second sub-pixel corresponding thereto.

11. The folding display panel according to claim 1, wherein the second folding area is an axisymmetric figure, a symmetrical axis of symmetry of the second folding area is a second symmetrical axis, the second display area and the third display area are symmetric along the second symmetrical axis, a distribution pattern of the second sub-pixels and a distribution pattern of the third sub-pixels are symmetric along the second symmetrical axis.

12. The folding display panel according to claim 11, wherein deformation of the second folding area rotates the third display area along the second symmetrical axis to cover the second display area, each of the third sub-pixels is located directly below the second sub-pixel corresponding thereto.

13. The folding display panel according to claim 1, wherein a material forming the plurality of first support columns and the second support columns is a white material or a transparent material, and surfaces of support columns have a diffuse reflection structure.

* * * * *